US012671413B2

(12) United States Patent
Gammie

(10) Patent No.: US 12,671,413 B2
(45) Date of Patent: Jun. 30, 2026

(54) SILICON CARBIDE DRIVER USING HIGH VOLTAGE CAPACITORS FOR ISOLATION AND SIGNAL TRANSMISSION

(71) Applicant: Microchip Technology Incorporated, Chandler, AZ (US)

(72) Inventor: David Gammie, Chandler, AZ (US)

(73) Assignee: Microchip Technology Incorporated, Chandler, AZ (US)

(*) Notice: Subject to any disclaimer, the term of this patent is extended or adjusted under 35 U.S.C. 154(b) by 29 days.

(21) Appl. No.: 18/966,025

(22) Filed: Dec. 2, 2024

(65) Prior Publication Data

US 2025/0183890 A1 Jun. 5, 2025

Related U.S. Application Data

(60) Provisional application No. 63/605,292, filed on Dec. 1, 2023.

(51) Int. Cl.
H03K 17/51 (2006.01)
H03K 17/567 (2006.01)
H03K 17/687 (2006.01)

(52) U.S. Cl.
CPC ....... H03K 17/567 (2013.01); H03K 17/6874 (2013.01); *H03K 2217/0063* (2013.01); *H03K 2217/0072* (2013.01)

(58) Field of Classification Search
CPC ...... H03K 17/51; H03K 17/56; H03K 17/567; H03K 17/62; H03K 17/6221;

(Continued)

(56) References Cited

U.S. PATENT DOCUMENTS

| | | | | |
|---|---|---|---|---|
| 10,615,786 B2 * | 4/2020 | Sugiyama | ............ | G09G 3/2074 |
| 2022/0417076 A1 * | 12/2022 | Bendotti | ............ | H04L 25/0272 |
| 2023/0101006 A1 | 3/2023 | Kuang | | |

FOREIGN PATENT DOCUMENTS

| | | |
|---|---|---|
| EP | 3896855 A1 | 10/2021 |
| EP | 4113845 A1 | 1/2023 |
| WO | 2009076329 A1 | 6/2009 |

OTHER PUBLICATIONS

International Search Report and the Written Opinion of the International Searching Authority, PCT/US2024/058160, Feb. 21, 2025, European Patent Office.

(Continued)

*Primary Examiner* — Long Nguyen
(74) *Attorney, Agent, or Firm* — Shumaker, Loop & Kendrick, LLP; Ryan M. Corbett

(57) ABSTRACT

A gate driver circuit to receive an input drive signal and output an output drive signal is provided. The gate driver circuit may include a first capacitor having first and second terminals, a second capacitor having first and second terminals, a first set of switches to selectively couple the first terminals of the first and second capacitors to the input drive signal and a power supply voltage, a second set of switches to selectively couple the second terminals of the first and second capacitors to a reference voltage and a high impedance node, and a comparator having a first terminal coupled to the reference voltage and a second terminal coupled to the high impedance node. The comparator may output the output drive signal based on a comparison of the reference voltage and a voltage at the high impedance node.

20 Claims, 7 Drawing Sheets

(58) Field of Classification Search
CPC ............. H03K 17/687; H03K 17/6871; H03K
17/6874; H03K 5/01; H03K 5/08; H03K
5/082; H03K 5/084; H03K 5/22; H03K
5/24; H03K 5/2472; H03K 5/2481; H03K
5/249; H03K 2217/0063; H03K
2217/0072; G01R 19/165; G01R
19/16566; G01R 19/16571; G01R
19/16576
See application file for complete search history.

(56) References Cited

OTHER PUBLICATIONS

T. Andersen, et al., "A capacitive level shifter for high voltage
(2.5kv)," (IPMHVC), 2012 IEEE International, Jun. 3, 2012, pp.
450-453.

* cited by examiner

200

TX IN 101

AC Carrier Signal 201
through Isolation Barrier 106

RX OUT 103

1

SILICON CARBIDE DRIVER USING HIGH VOLTAGE CAPACITORS FOR ISOLATION AND SIGNAL TRANSMISSION

CROSS-REFERENCE TO RELATED APPLICATION

The present application claims priority to U.S. Provisional Patent Application No. 63/605,292, entitled: Silicon Carbide Driver Using High Voltage Capacitors for Isolation and Signal Transmission, filed on Dec. 1, 2023, the contents of which are hereby incorporated by reference in their entirety.

TECHNICAL FIELD

The present disclosure relates generally to silicon carbide (SiC) drivers, and more specifically to SiC drivers that pass an input drive signal from a high voltage domain to a low voltage domain using capacitor coupling and charging.

SUMMARY

According to an aspect of one or more examples, there is provided a gate driver circuit to receive an input drive signal and output an output drive signal. The gate driver circuit may include a first capacitor having first and second terminals, a second capacitor having first and second terminals, a first set of switches to selectively couple the first terminals of the first and second capacitors to the input drive signal and a power supply voltage, a second set of switches to selectively couple the second terminals of the first and second capacitors to a reference voltage and a high impedance node, and a comparator having a first terminal coupled to the reference voltage and a second terminal coupled to the high impedance node. The comparator may output the output drive signal based on a comparison of the reference voltage and a voltage at the high impedance node. The first set of switches may be high voltage domain switches, and the second set of switches may be low voltage domain switches. The first set of switches may selectively couple the first terminals of the first and second capacitors to the input drive signal and the power supply voltage, and the second set of switches may selectively couple the second terminals of the first and second capacitors to the reference voltage and the high impedance node, based on a clock signal. When clock signal is low the first set of switches may couple the first terminal of the first capacitor to the input drive signal, and couple the first terminal of the second capacitor to the power supply voltage, and when the clock signal is low the second set of switches may couple the second terminal of the first capacitor to the high impedance node, and couple the second terminal of the second capacitor to the reference voltage. The second capacitor may be charged with a difference between the power supply voltage and the reference voltage when the clock signal is low. When the clock signal is high the first set of switches may couple the first terminal of the first capacitor to the power supply voltage, and couple the first terminal of the second capacitor to the input drive signal, and when the clock signal is high the second set of switches may couple the second terminal of the first capacitor to the reference voltage, and couple the second terminal of the second capacitor to the high impedance node. The first capacitor may be charged with the difference between the power supply voltage and the reference voltage when the clock signal is high. The voltage at the high impedance node may range from approximately −0.5V to approximately 4.5V. The reference voltage may be approximately 2V. The input drive signal may be approximately 2005V and the power supply voltage may be approximately 2002.5V. The input drive signal may be approximately 2000V and the power supply voltage may be approximately 2002.5V. The output drive signal may be approximately 5V when the voltage at the high impedance node is approximately 4.5V. The output drive signal may be approximately 0V when the voltage at the high impedance node is approximately −0.5V.

According to an aspect of one or more examples, there is provided an integrated circuit (IC). The IC may include a primary side including a first capacitor having first and second terminals, a second capacitor having first and second terminals, and a first set of switches to receive an input drive signal and a power supply voltage, and selectively couple the first terminals of the first and second capacitors to the input drive signal and the power supply voltage. The IC may include a secondary side including a second set of switches to selectively couple the second terminals of the first and second capacitors to a reference voltage and a high impedance node, and a comparator having a first terminal coupled to the reference voltage and a second terminal coupled to the high impedance node, the comparator to compare the reference voltage and a voltage at a high impedance node to generate an output drive signal based on the comparison. The primary side may also include an input logic block to receive the input drive signal and output a modified input drive signal to the first set of switches. The first and second capacitors may be 2000V lateral capacitors. The input drive signal may be sampled at approximately 100 MHz clocking.

According to an aspect of one or more examples, there is provided a method for driving a silicon carbide (SiC) transistor. The method may include selectively coupling first terminals of first and second capacitors to an input drive signal and a power supply voltage using a first set of switches, selectively coupling second terminals of the first and second capacitors to a reference voltage and a high impedance node using a second set of switches, coupling a first terminal of a comparator to the reference voltage and a second terminal of the comparator to the high impedance node, and outputting an output drive signal based on a comparison of the reference voltage and a voltage at the high impedance node using the comparator. The first set of switches may be high voltage domain switches, and the second set of switches may be low voltage domain switches. Selectively coupling the first terminals of the first and second capacitors to the input drive signal and the power supply voltage using the first set of switches, and selectively coupling the second terminals of the first and second capacitors to the reference voltage and the high impedance node using the second set of switches, may be based on a clock signal.

DETAILED DESCRIPTION OF VARIOUS EXAMPLES

Figure 1:
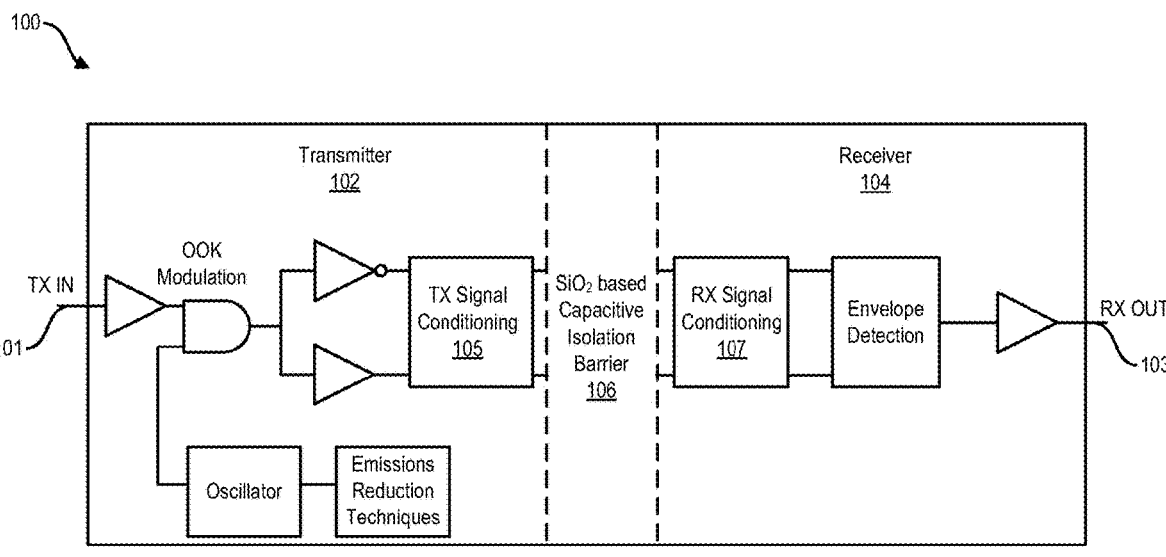
FIG. 1 shows a functional block diagram of a silicon carbide driver according to the prior art.

Reference will now be made in detail to the following various examples, which are illustrated in the accompanying drawings, wherein like reference numerals refer to like elements throughout. The following examples may be embodied in various forms without being limited to the examples set forth herein.

Figure 2:
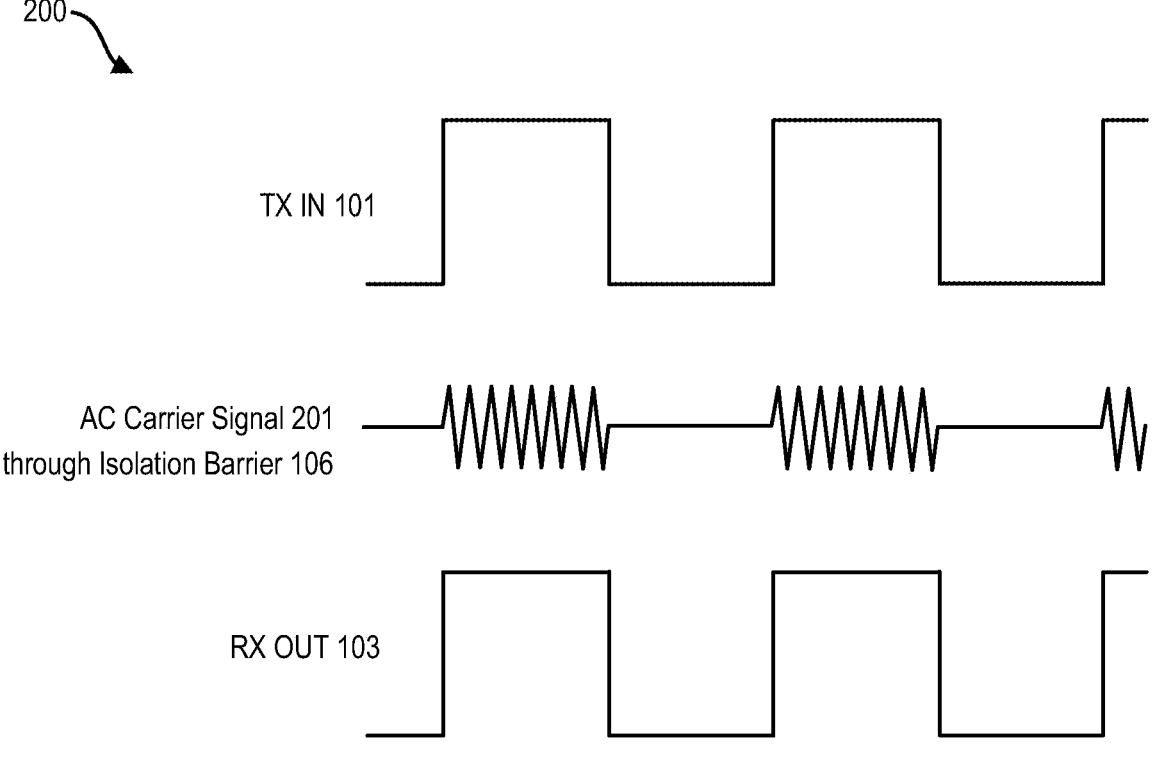
FIG. 2 shows an on-off keying based modulation scheme used by the silicon carbide driver of FIG. 1.

In silicon carbide gate drivers, there is a need to receive a high voltage input drive signal (e.g., approximately 2,000V), and output a low voltage output drive signal (e.g., approximately 5V). FIG. 1 shows a functional block diagram of a silicon carbide driver 100 according to the prior art. FIG. 2 shows an on-off keying based modulation scheme 200 used by the silicon carbide driver 100 of FIG. 1. In describing the functionality of FIG. 1, description of certain components is omitted in order to avoid obscuring the inventive concept. Referring to FIGS. 1 and 2, an input signal TX IN 101 is input to a transmitter 102, and an output signal RX OUT 103 is output from a receiver 104. The input signal TX IN 101 and the output signal RX OUT 103 may be digital signals, as shown in FIG. 2. The transmitter 102 of FIG. 1 includes a TX signal conditioning circuit 105 that may generate and modulate an AC carrier signal based on the input signal TX IN 101. For example, as shown in FIG. 2, the TX signal conditioning circuit 105 may modulate the frequency of the AC carrier signal 201 to correspond to the digital high and low levels of the input signal TX IN 101. As shown in FIG. 1, the transmitter 102 and the receiver 104 may be separated by a capacitive isolation barrier 106, such as a silicon dioxide (SiO$_2$) barrier. The AC carrier signal 201 may propagate through the capacitive isolation barrier 106, and may be received by an RX signal conditioning circuit 107 that demodulates the AC carrier signal 201 to generate the digital output signal RX OUT 103. The TX signal conditioning circuit 105 and the RX signal conditioning circuit 107 may be modulated at approximately 250 MHz to 300 MHz, which consumes a substantial amount of current. The steps of modulating and demodulating the input signal TX IN 101 require modulating and demodulating components, which take up space and delay the output signal RX OUT 103. Therefore, a circuit that may address one or more of these issues is needed.

Figure 3:
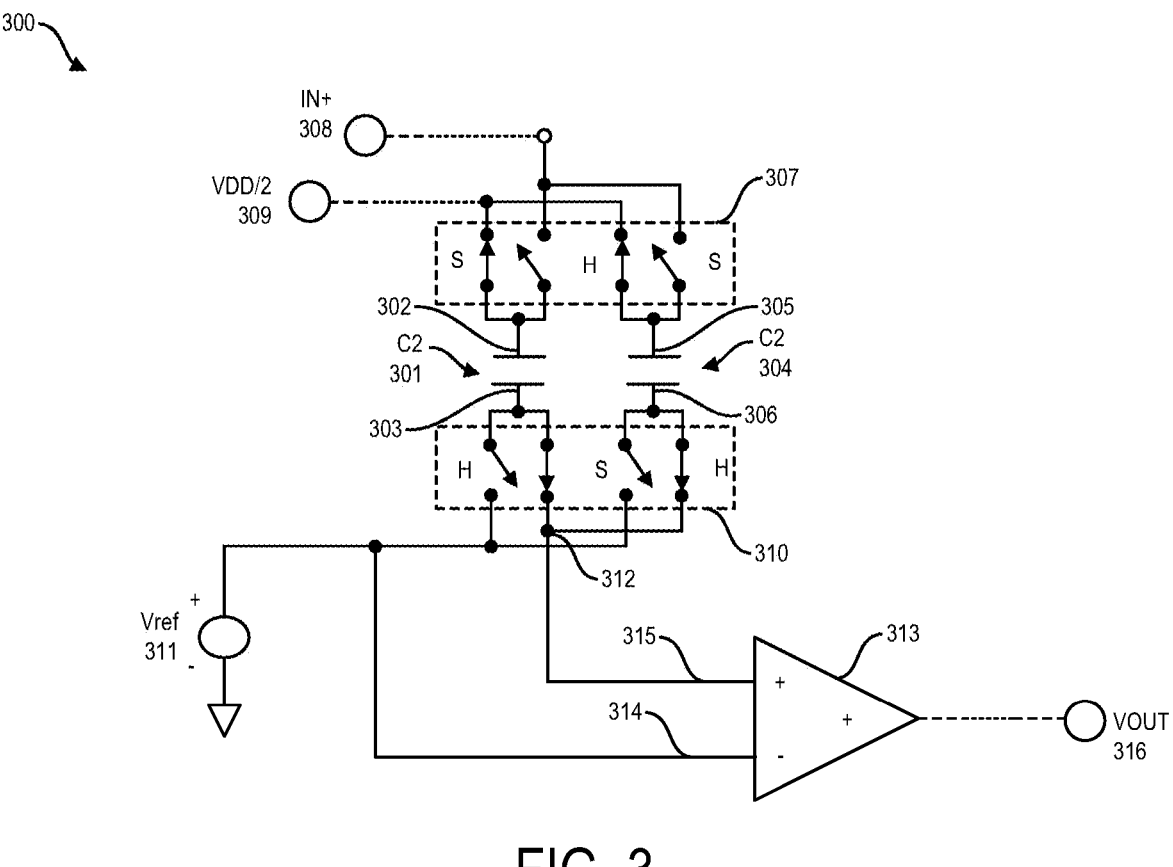
FIG. 3 shows a circuit diagram of a gate driver circuit according to one or more examples.

FIG. 3 shows a circuit diagram of a gate driver circuit 300 according to one or more examples. The gate driver circuit 300 according to one or more examples in FIG. 3 may include a first capacitor C1 301 having a first terminal 302 and a second terminal 303, and a second capacitor C2 304 having a first terminal 305 and a second terminal 306. The first terminal 302 of the first capacitor C1 301 and the first terminal 305 of the second capacitor C2 304 may be coupled to a first set of switches 307 that may selectively couple the first terminals 302, 305 of the first and second capacitors C1

301, C2 304 to an input drive signal IN+ 308 and a power supply voltage VDD/2 309. According to one or more examples, the power supply voltage VDD/2 309 coupled to the first set of switches 307 may be a power supply voltage VDD/2 309 supplied to an integrated circuit (e.g., integrated circuit 700 in FIG. 7) containing the gate driver circuit 300, or may be a representation of the power supply voltage VDD/2 309 supplied to the integrated circuit, as shown in FIG. 3, in which the power supply voltage VDD/2 309 to the gate driver circuit 300 is half of the voltage supplied to the integrated circuit VDD. Although the power supply voltage VDD/2 309 supplied to the gate driver circuit 300 shown in the example of FIG. 3 is half of the voltage supplied to the integrated circuit, other representations (e.g., ⅓, ¼, etc.) of the voltage supplied to the integrated circuit may be used.

The gate driver circuit 300 according to the one or more examples of FIG. 3 may also include a second set of switches 310 that may selectively couple the second terminals 303, 306 of the first and second capacitors C1 301, C2 304 to a reference voltage Vref 311 and a high impedance node 312. The first set of switches and the second set of switches 307, 310 may be coupled to a clock signal, and may selectively couple the first terminals 302, 305 of the first and second capacitors C1 301, C2 304 to the input drive signal IN+ 308 and the power supply voltage VDD/2 309, and selectively couple the second terminals 303, 306 of the first and second capacitors C1 301, C2 304 to the reference voltage Vref 311 and the high impedance node 312, based on the clock signal. The gate driver circuit 300 of FIG. 3 may also include a comparator 313 having a first terminal 314 coupled to the reference voltage Vref 311, and a second terminal 315 coupled to the high impedance node 312. The comparator 313 may output an output drive signal VOUT 316 based on a comparison of the reference voltage Vref 311 and a voltage at the high impedance node 312.

Figure 4:
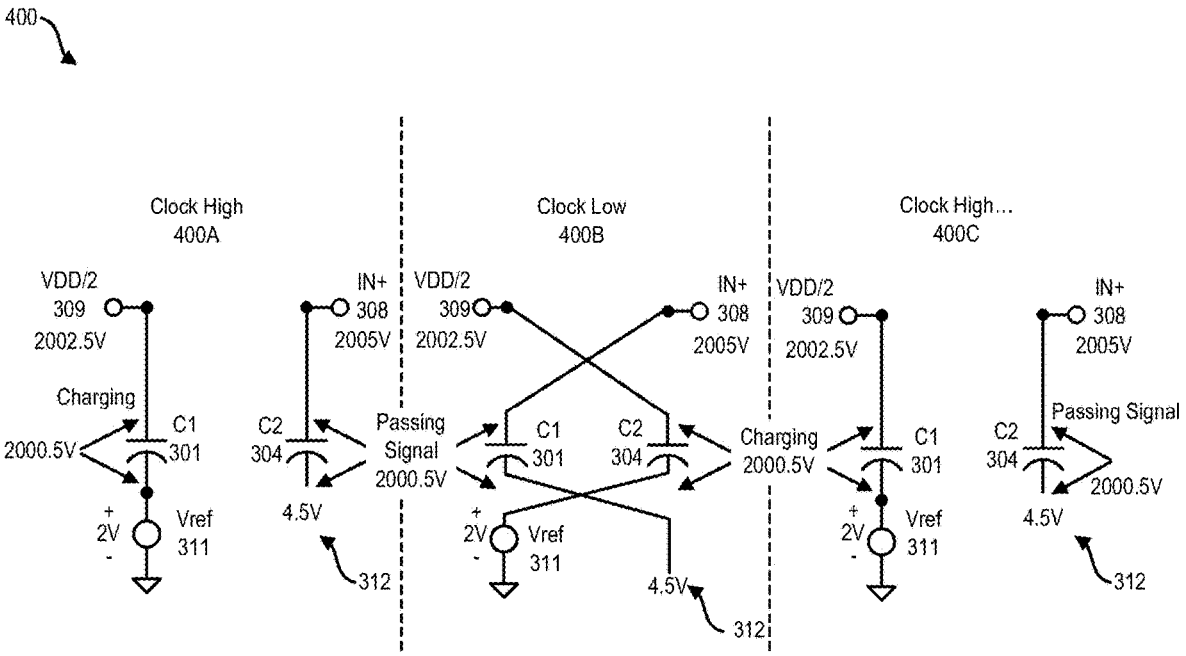
FIG. 4 shows a functional diagram demonstrating the functionality of the switches of the gate driver circuit of FIG. 3 with a high input drive signal according to one or more examples.

FIG. 4 shows a functional diagram 400 demonstrating the functionality of the switches 307, 310 of the gate driver circuit 300 of FIG. 3 with a high input drive signal IN+ 308 according to one or more examples. As explained above, the first and second sets of switches 307, 310 may be controlled in response to a clock signal that oscillates between high and low states. FIG. 4 shows the operation of the first and second sets of switches 307, 310 at three instances in time 400A, 400B, and 400C. The left portion 400A of FIG. 4 shows the first and second sets of switches 307, 310 when the clock signal is high, the center portion 400B of FIG. 4 shows the first and second sets of switches 307, 310 when the clock signal is low, and the right portion 400C of FIG. 4 shows the first and second sets of switches 307, 310 when the clock signal is high. All three portions 400A, 400B, and 400C of FIG. 4 demonstrate operation of the gate driver circuit 300 of FIG. 3 when the input drive signal IN+ 308 is high. In the example shown in FIG. 4, the high state of the input drive signal IN+ 308 is shown as 2005V, and the power supply voltage VDD/2 309 is 2002.5V, though these values assume a common mode signal of 2000V. Other values for the input drive signal IN+ 308, power supply voltage VDD/2 309, and the common mode signal may be chosen.

Referring to the center portion 400B of FIG. 4, when the clock signal is low, the first set of switches 307 couples the first terminal 305 of the second capacitor C2 304 to the power supply voltage VDD/2 309 (which is 2002.5V), and the second set of switches 310 couples the second terminal 306 of the second capacitor C2 304 to the reference voltage Vref 311 (which is set at 2V, though other reference voltages may be used). The second capacitor C2 304 is therefore charged with the difference between the power supply voltage VDD/2 309 (e.g., 2002.5V) and the reference voltage Vref 311 (e.g., 2V), which is 2000.5V. When the clock signal is low, the first set of switches 307 also couples the first terminal 302 of the first capacitor C1 301 to the input drive signal IN+ 308, and the second set of switches 310 couples the second terminal 303 of the first capacitor C1 301 to the high impedance node 312.

When the clock signal becomes high, the first set of switches 307 couples the first terminal 305 of the second capacitor C2 304 to the input drive signal IN+ 308, which is 2005V, and couples the second terminal 306 of the second capacitor C2 304 to the high impedance node 312. In order for the second capacitor C2 304 to maintain the 2000.5V across it from when the clock signal was low, the voltage at the high impedance node 312 becomes 4.5V because the voltage at the first terminal 305 of the second capacitor C2 304 has increased from 2002.5V (when the clock signal was low) to 2005V. When the clock signal is high, the first set of switches 307 also couples the first terminal 302 of the first capacitor C1 301 to the power supply voltage VDD/2 309 (which is 2002.5V), and the second set of switches 310 couples the second terminal 303 of the first capacitor C1 301 to the reference voltage Vref 311 (which is 2V). By maintaining the 4.5V at the high impedance node 312 coupled to the second terminal 306 of the second capacitor C2 304, the high input drive signal IN+ 308 is passed to the comparator 313, as explained below. During the high clock cycle, the first capacitor C1 301 is charged with 2000.5V (i.e., the difference between the power supply voltage VDD/2 309 and the reference voltage Vref 311). When the clock signal returns to the low clock cycle (center portion 400B of FIG. 4), the first set of switches 307 causes the first terminal 302 of the first capacitor C1 301 to be coupled to the input drive signal IN+ 308 (e.g., 2005V), and the second set of switches 310 causes the second terminal 303 of the first capacitor C1 301 to be coupled to the high impedance node 312. In order to maintain the 2000.5V across the first capacitor C1 301, the voltage at the high impedance node 312 remains 4.5V, passing the high input drive signal IN+ 308 to the comparator 313. By repeating this process as the clock signal cycles between high and low states, the input drive signal IN+ 308 is accurately and quickly provided to the comparator 313 to output the output drive signal VOUT 316, as explained below. In addition, the gate driver circuit 300 is able to transfer the 2005V input drive signal IN+ 308 from the high voltage domain to the low voltage domain (e.g., 4.5V).

Figure 5:
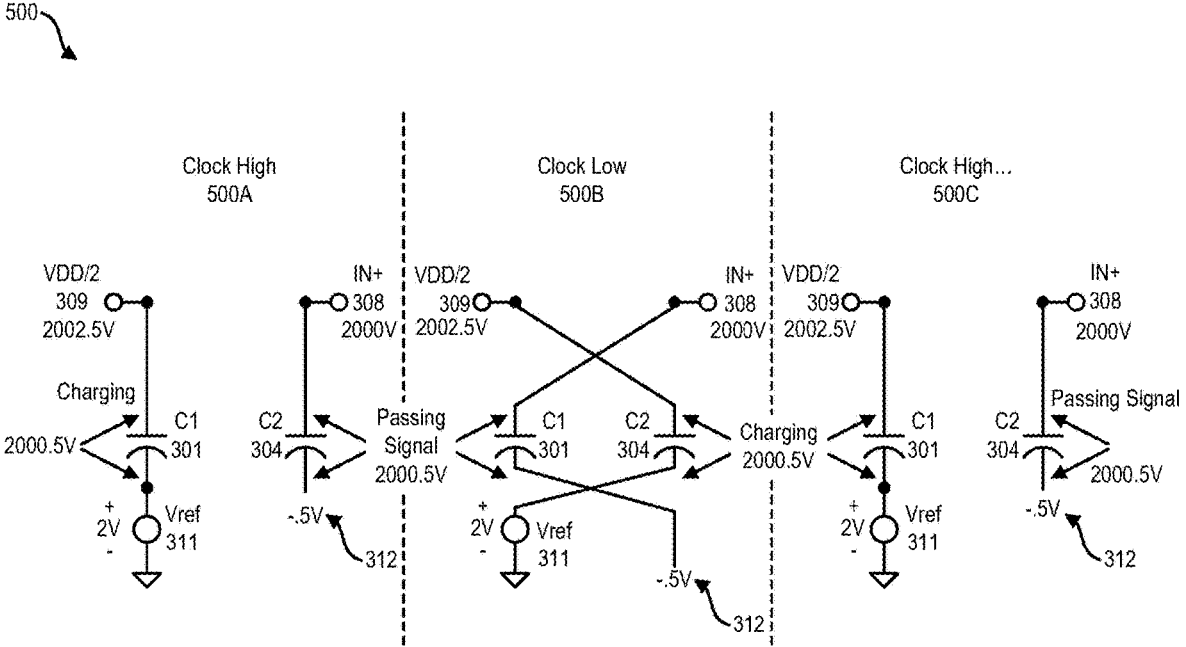
FIG. 5 shows a functional diagram demonstrating the functionality of the switches of the gate driver circuit of FIG. 3 with a low input drive signal according to one or more examples.

FIG. 5 shows a functional diagram 500 demonstrating the functionality of the switches 307, 310 of the gate driver circuit 300 of FIG. 3 with a low input drive signal IN+ 308 according to one or more examples. Like FIG. 4, FIG. 5 shows the operation of the first and second sets of switches 307, 310 at three instances in time 500A, 500B, and 500C. The left portion 500A of FIG. 5 shows the first and second sets of switches 307, 310 when the clock signal is high, the center portion 500B of FIG. 5 shows the first and second sets of switches 307, 310 when the clock signal is low, and the right portion 500C of FIG. 5 shows the first and second sets of switches 307, 310 when the clock signal is high. All three portions 500A, 500B, and 500C of FIG. 5 demonstrate operation of the gate driver circuit 300 of FIG. 3 when the input drive signal IN+ 308 is low. In the example shown in FIG. 5, the low state of the input drive signal IN+ 308 is shown as 2000V, and the power supply voltage VDD/2 309 is 2002.5V, though these values assume a common mode signal of 2000V. Other values for the input drive signal IN+ 308, power supply voltage VDD/2 309, and the common mode signal may be chosen.

Referring to the center portion 500B of FIG. 5, when the clock signal is low, the first set of switches 307 couples the first terminal 305 of the second capacitor C2 304 to the power supply voltage VDD/2 309 (which is 2002.5V), and the second set of switches 310 couples the second terminal 306 of the second capacitor C2 304 to the reference voltage Vref 311 (which is set at 2V). The second capacitor C2 304 is therefore charged with the difference between the power supply voltage VDD/2 309 (e.g., 2002.5V) and the reference voltage Vref 311 (e.g., 2V), which is 2000.5V. When the clock signal is low, the first set of switches 307 also couples the first terminal 302 of the first capacitor C1 301 to the input drive signal IN+ 308, and the second set of switches 310 couples the second terminal 303 of the first capacitor C1 301 to the high impedance node 312.

When the clock signal becomes high, the first set of switches 307 couples the first terminal 305 of the second capacitor C2 304 to the input drive signal IN+ 308, which is 2000V, and couples the second terminal 306 of the second capacitor C2 304 to the high impedance node 312. In order for the second capacitor C2 304 to maintain the 2000.5V across it from when the clock signal was low, the voltage at the high impedance node 312 becomes −0.5V because the voltage at the first terminal 305 of the second capacitor C2 304 has decreased from 2002.5V (when the clock signal was low) to 2000V. When the clock signal is high, the first set of switches 307 also couples the first terminal 302 of the first capacitor C1 301 to the power supply voltage VDD/2 309 (which is 2002.5V), and the second set of switches 310 couples the second terminal 303 of the first capacitor C1 301 to the reference voltage Vref 311 (which is 2V). By maintaining the −0.5V at the high impedance node 312 coupled to the second terminal 306 of the second capacitor C2 304, the low input drive signal IN+ 308 is passed to the comparator 313, as explained below. During the high clock cycle, the first capacitor C1 301 is charged with 2000.5V (i.e., the difference between the power supply voltage VDD/2 309 and the reference voltage Vref 311). When the clock signal returns to the low clock cycle (center portion 500B of FIG. 5), the first set of switches 307 causes the first terminal 302 of the first capacitor C1 301 to be coupled to the input drive signal IN+ 308 (e.g., 2000V), and the second set of switches 310 causes the second terminal 303 of the first capacitor C1 301 to be coupled to the high impedance node 312. In order to maintain the 2000.5V across the first capacitor C1 301, the voltage at the high impedance node 312 remains-0.5V, passing the low input drive signal IN+ 308 to the comparator 313. By repeating this process as the clock signal cycles between high and low states, the input drive signal IN+ 308 is accurately and quickly provided to the comparator 313 to output the output drive signal VOUT 316, as explained below. In addition, the gate driver circuit 300 is able to transfer the 2000V input drive signal IN+ 308 from the high voltage domain to the low voltage domain (e.g., −0.5V).

Figure 6A:
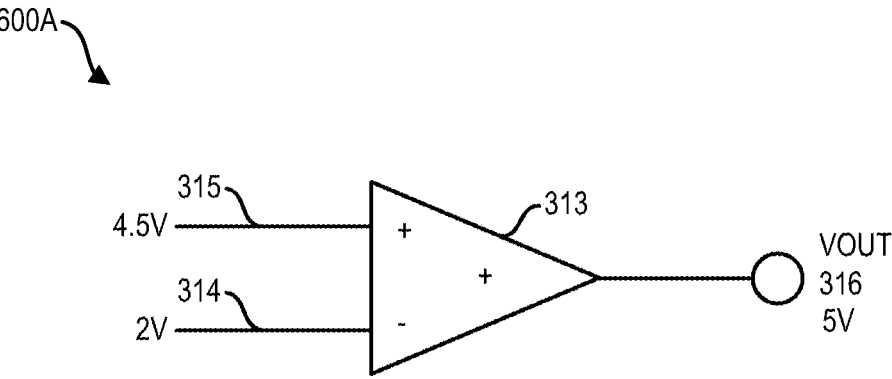
FIG. 6A shows a diagram of the comparator of the gate driver circuit of FIG. 3 when the input drive signal is high according to one or more examples.
Figure 6B:
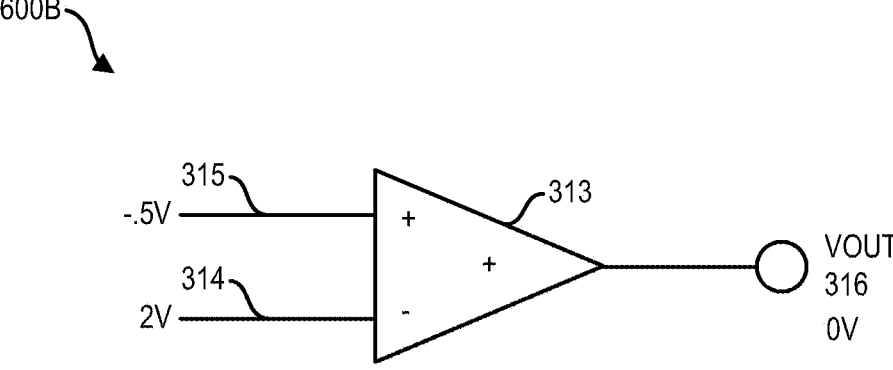
FIG. 6B shows a diagram of the comparator of the gate driver circuit of FIG. 3 when the input drive signal is low according to one or more examples.

FIG. 6A shows a diagram 600A of the comparator 313 of the gate driver circuit 300 of FIG. 3 when the input drive signal IN+ 308 is high according to one or more examples. FIG. 6B shows a diagram 600B of the comparator 313 of the gate driver circuit 300 of FIG. 3 when the input drive signal IN+ 308 is low according to one or more examples. In FIG. 6A, when the input drive signal IN+ 308 is high, the voltage at the high impedance node 312 is 4.5V, as explained above. The comparator 313 of the gate driver circuit 300 of FIG. 3 has a first terminal 314 that is coupled to the reference voltage Vref 311, which in this example is 2V. The high impedance node 312 is coupled to a second terminal 315 of the comparator 313, such that the second terminal 315 of the comparator 313 receives the 4.5V at the high impedance node 312 when the input drive signal IN+ 308 is high. The comparator 313 outputs the output drive signal VOUT 316 based on a comparison of the reference voltage Vref 311 (e.g., 2V) and the voltage at the high impedance node 312 (e.g., 4.5V). For example, the comparator 313 may output an output drive signal VOUT 316 of 5V based on the comparison of the 4.5V signal at the high impedance node 312 and the 2V reference voltage Vref 311.

In FIG. 6B, when the input drive signal IN+ 308 is low, the voltage at the high impedance node 312 is –0.5V, as explained above. The first terminal 314 of the comparator 313 is coupled to the reference voltage Vref 311, which in this example is set to 2V. The second terminal 315 of the comparator 313 is coupled to the high impedance node 312 such that the second terminal 315 of the comparator 313 receives the –0.5V when the input drive signal IN+ 308 is low. The comparator 313 outputs the output drive signal VOUT 316 based on a comparison of the reference voltage Vref 311 (e.g., 2V) and the voltage at the high impedance node 312 (e.g., –0.5V). For example, the comparator 313 may output an output drive signal VOUT 316 of 0V based on the comparison of the –0.5V signal at the high impedance node 312 and the 2V reference voltage Vref 311.

Figure 7:
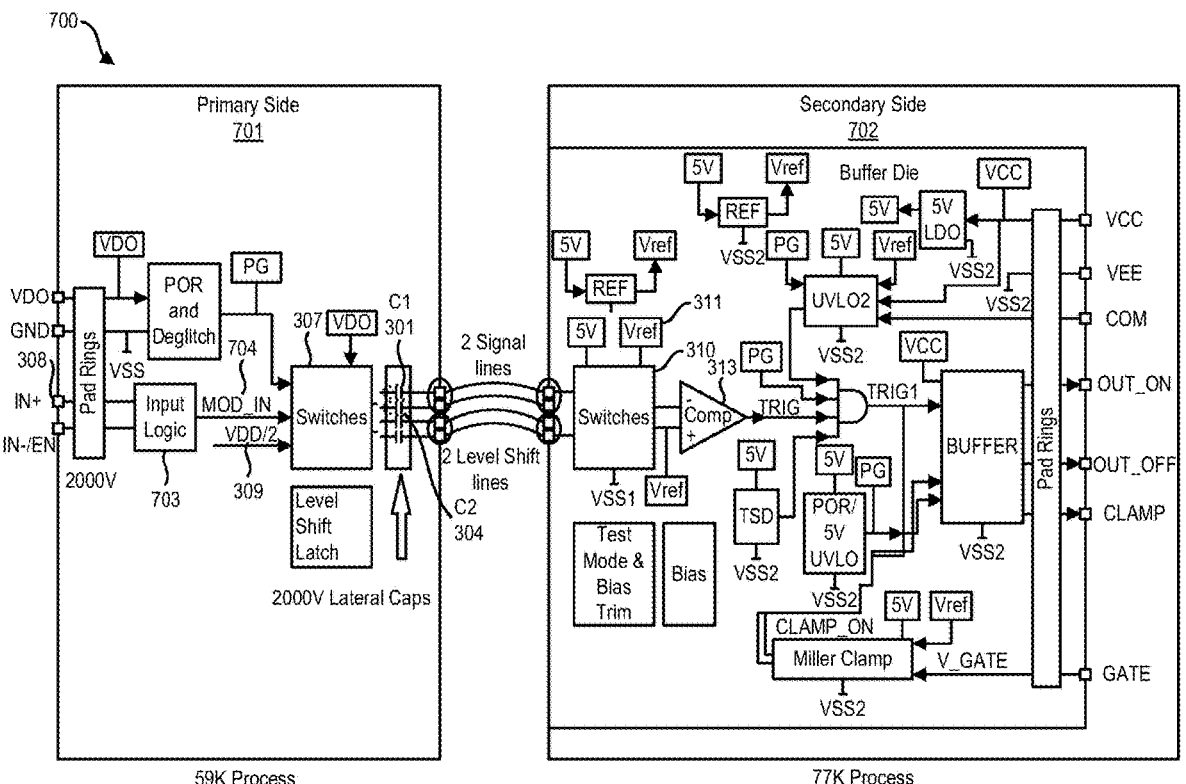
FIG. 7 shows a diagram of an integrated circuit containing a gate driver circuit according to one or more examples.

FIG. 7 shows a diagram of an integrated circuit 700 containing a gate driver circuit 300 according to one or more examples. The diagram of FIG. 7 shows a number of elements that may be used to implement the gate driver circuit 300 according to one or more examples, the discussion of which is omitted to improve clarity. The circuit 700 of FIG. 7 may have a primary side 701 and a secondary side 702. The primary side 701 may include the first set of switches 307 to receive the input drive signal IN+ 308 and the power supply voltage VDD/2 309. According to one or more examples, the input drive signal IN+ 308 may be received by an input logic block 703, which may output a modified input drive signal MOD_IN 704 to the first set of switches 307. The primary side 701 may also include the first and second capacitors C1 301, C2 304, which may be 2000V lateral capacitors according to one or more examples. The secondary side 702 may include the second set of switches 310, a reference voltage source, and the comparator 313 that compares the reference voltage Vref 311 and the voltage at the high impedance node 312 to generate the output drive signal VOUT 316 based on the comparison. By using capacitor coupling and charging to transfer the high voltage input drive signal IN+ 308 to a low voltage output drive signal VOUT 316, the gate drive circuit 300 according to one or more examples may be faster than relying on modulating and demodulating the input driver signal, may use less space by not using modulating and demodulating circuitry, and may consume less current than using an ultra-fast oscillator for modulation and demodulation. The input drive signal IN+ 308 may be sampled frequently, for example at 100 MHz clocking, which may allow for accurate reading that may mitigate glitching.

Various examples have been disclosed herein, in connection with the above description and the drawings. It will be understood that it would be unduly repetitious to literally describe and illustrate every combination and subcombination of these examples. Accordingly, all examples can be combined in any way or combination, and the present specification, including the drawings, shall be construed to constitute a complete written description of all combinations and subcombinations of the examples described herein, and of the manner and process of making and using them, and shall support claims to any such combination or subcombination.

It will be appreciated by persons skilled in the art that the examples described herein are not limited to what has been particularly shown and described herein above. In addition, unless mention was made above to the contrary, it should be noted that all of the accompanying drawings are not to scale. A variety of modifications and variations are possible in light of the above teachings.

What is claimed is:

1. A gate driver circuit to receive an input drive signal and output an output drive signal, the gate driver circuit comprising:
   a first capacitor having first and second terminals;
   a second capacitor having first and second terminals;
   a first set of switches to selectively couple the first terminals of the first and second capacitors to the input drive signal and a power supply voltage;
   a second set of switches to selectively couple the second terminals of the first and second capacitors to a reference voltage and a high impedance node; and
   a comparator having a first terminal coupled to the reference voltage and a second terminal coupled to the high impedance node;
   wherein the comparator is to output the output drive signal based on a comparison of the reference voltage and a voltage at the high impedance node.

2. The gate driver circuit of claim 1, wherein the first set of switches are high voltage domain switches, and the second set of switches are low voltage domain switches.

3. The gate driver circuit of claim 1, wherein the first set of switches is to selectively couple the first terminals of the first and second capacitors to the input drive signal and the power supply voltage, and the second set of switches is to selectively couple the second terminals of the first and second capacitors to the reference voltage and the high impedance node, based on a clock signal.

4. The gate driver circuit of claim 3, wherein when the clock signal is low the first set of switches are to couple the first terminal of the first capacitor to the input drive signal, and couple the first terminal of the second capacitor to the power supply voltage; and
   wherein when the clock signal is low the second set of switches are to couple the second terminal of the first capacitor to the high impedance node, and couple the second terminal of the second capacitor to the reference voltage.

5. The gate driver circuit of claim 4, wherein the second capacitor is charged with a difference between the power supply voltage and the reference voltage when the clock signal is low.

6. The gate driver circuit of claim 3, wherein when the clock signal is high the first set of switches are to couple the first terminal of the first capacitor to the power supply voltage, and couple the first terminal of the second capacitor to the input drive signal; and
   wherein when the clock signal is high the second set of switches are to couple the second terminal of the first capacitor to the reference voltage, and couple the second terminal of the second capacitor to the high impedance node.

7. The gate driver circuit of claim 6, wherein the first capacitor is charged with the difference between the power supply voltage and the reference voltage when the clock signal is high.

8. The gate driver circuit of claim 1, wherein the voltage at the high impedance node ranges from approximately −0.5V to approximately 4.5V.

9. The gate driver circuit of claim 1, wherein the reference voltage is approximately 2V.

10. The gate driver circuit of claim 1, wherein the input drive signal is approximately 2005V and the power supply voltage is approximately 2002.5V.

11. The gate driver circuit of claim 1, wherein the input drive signal is approximately 2000V and the power supply voltage is approximately 2002.5V.

12. The gate driver circuit of claim 1, wherein the output drive signal is approximately 5V when the voltage at the high impedance node is approximately 4.5V.

13. The gate driver circuit of claim 1, wherein the output drive signal is approximately 0V when the voltage at the high impedance node is approximately −0.5V.

14. An integrated circuit (IC) comprising:
a primary side comprising:
    a first capacitor having first and second terminals;
    a second capacitor having first and second terminals; and
    a first set of switches to receive an input drive signal and a power supply voltage, and selectively couple the first terminals of the first and second capacitors to the input drive signal and the power supply voltage;
a secondary side comprising:
    a second set of switches to selectively couple the second terminals of the first and second capacitors to a reference voltage and a high impedance node; and
    a comparator having a first terminal coupled to the reference voltage and a second terminal coupled to the high impedance node, the comparator to compare the reference voltage and a voltage at a high impedance node to generate an output drive signal based on the comparison.

15. The IC of claim 14, wherein the primary side further comprises an input logic block to receive the input drive signal and output a modified input drive signal to the first set of switches.

16. The IC of claim 14, wherein the first and second capacitors are 2000V lateral capacitors.

17. The IC of claim 14, wherein the input drive signal is sampled at approximately 100 MHz clocking.

18. A method for driving a silicon carbide (SiC) transistor, the method comprising:
selectively coupling first terminals of first and second capacitors to an input drive signal and a power supply voltage using a first set of switches;
selectively coupling second terminals of the first and second capacitors to a reference voltage and a high impedance node using a second set of switches;
coupling a first terminal of a comparator to the reference voltage and a second terminal of the comparator to the high impedance node; and
outputting an output drive signal based on a comparison of the reference voltage and a voltage at the high impedance node using the comparator.

19. The method of claim 18, wherein the first set of switches are high voltage domain switches, and the second set of switches are low voltage domain switches.

20. The method of claim 18, wherein selectively coupling the first terminals of the first and second capacitors to the input drive signal and the power supply voltage using the first set of switches, and selectively coupling the second terminals of the first and second capacitors to the reference voltage and the high impedance node using the second set of switches, is based on a clock signal.

\* \* \* \* \*